United States Patent
Tsai

(10) Patent No.: US 8,473,793 B2
(45) Date of Patent: Jun. 25, 2013

(54) LOW LEAKAGE BOUNDARY SCAN DEVICE DESIGN AND IMPLEMENTATION

(75) Inventor: Min-Hsiu Tsai, Zhubei (TW)

(73) Assignee: Global Unichip Corporation, Hsin-chu (TW)

( * ) Notice: Subject to any disclaimer, the term of this patent is extended or adjusted under 35 U.S.C. 154(b) by 277 days.

(21) Appl. No.: 12/802,678

(22) Filed: Jun. 10, 2010

(65) Prior Publication Data
US 2011/0307749 A1    Dec. 15, 2011

(51) Int. Cl.
*G01R 31/28*    (2006.01)
(52) U.S. Cl.
USPC ............................................. 714/727; 714/30
(58) Field of Classification Search
USPC ............................................. 714/727; 326/33
See application file for complete search history.

(56) References Cited

U.S. PATENT DOCUMENTS

| | | |
|---|---|---|
| 5,490,151 A | 2/1996 | Feger et al. |
| 5,491,666 A | 2/1996 | Sturges |
| 5,859,860 A | 1/1999 | Whetsel |
| 6,108,807 A | 8/2000 | Ke |
| 6,185,710 B1 | 2/2001 | Barnhart |
| 6,429,454 B2 | 8/2002 | Hatada et al. |
| 6,635,934 B2 * | 10/2003 | Hidaka .......................... 257/369 |
| 6,658,632 B1 | 12/2003 | Parulkar et al. |
| 6,671,860 B2 | 12/2003 | Langford, II |
| 6,911,703 B2 * | 6/2005 | Hidaka .......................... 257/369 |
| 7,167,991 B2 | 1/2007 | Higashida |
| 7,295,036 B1 * | 11/2007 | Zaveri et al. ..................... 326/38 |
| 7,521,762 B2 * | 4/2009 | Hidaka .......................... 257/369 |
| 7,581,124 B1 * | 8/2009 | Jacobson et al. .............. 713/310 |

* cited by examiner

*Primary Examiner* — Esaw Abraham
(74) *Attorney, Agent, or Firm* — Saile Ackerman LLC; Stephen B. Ackerman

(57) ABSTRACT

A boundary scan circuit containing a freeze circuit and a transparency circuit that provides a capability to selectively place portions of a system logic in a sleep mode and thereby conserving power. There are two transparency circuit configurations, one that connects to an input pad cell and one that connects to an output pad cell. The circuitry in the transparency circuit is controlled in such a manner as to establish at the output of transparency circuit a known logic state to control leakage current resulting from the circuitry of the various pad cell configurations, which further conserves power during sleep mode.

13 Claims, 7 Drawing Sheets

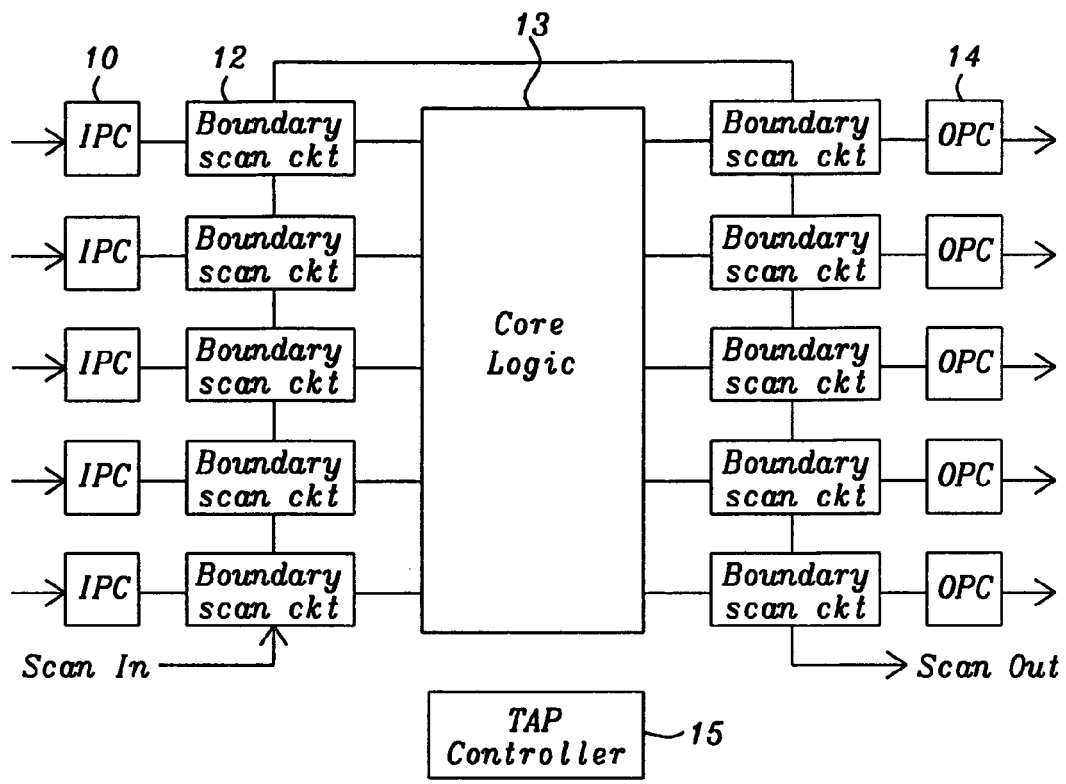
FIG. 1A – Prior Art
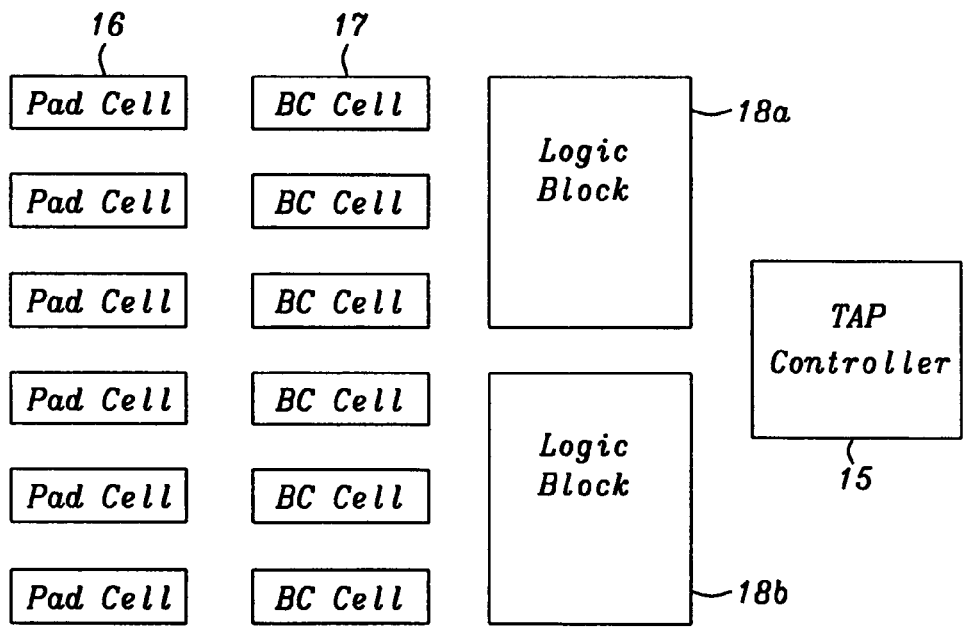
FIG. 1B – Prior Art

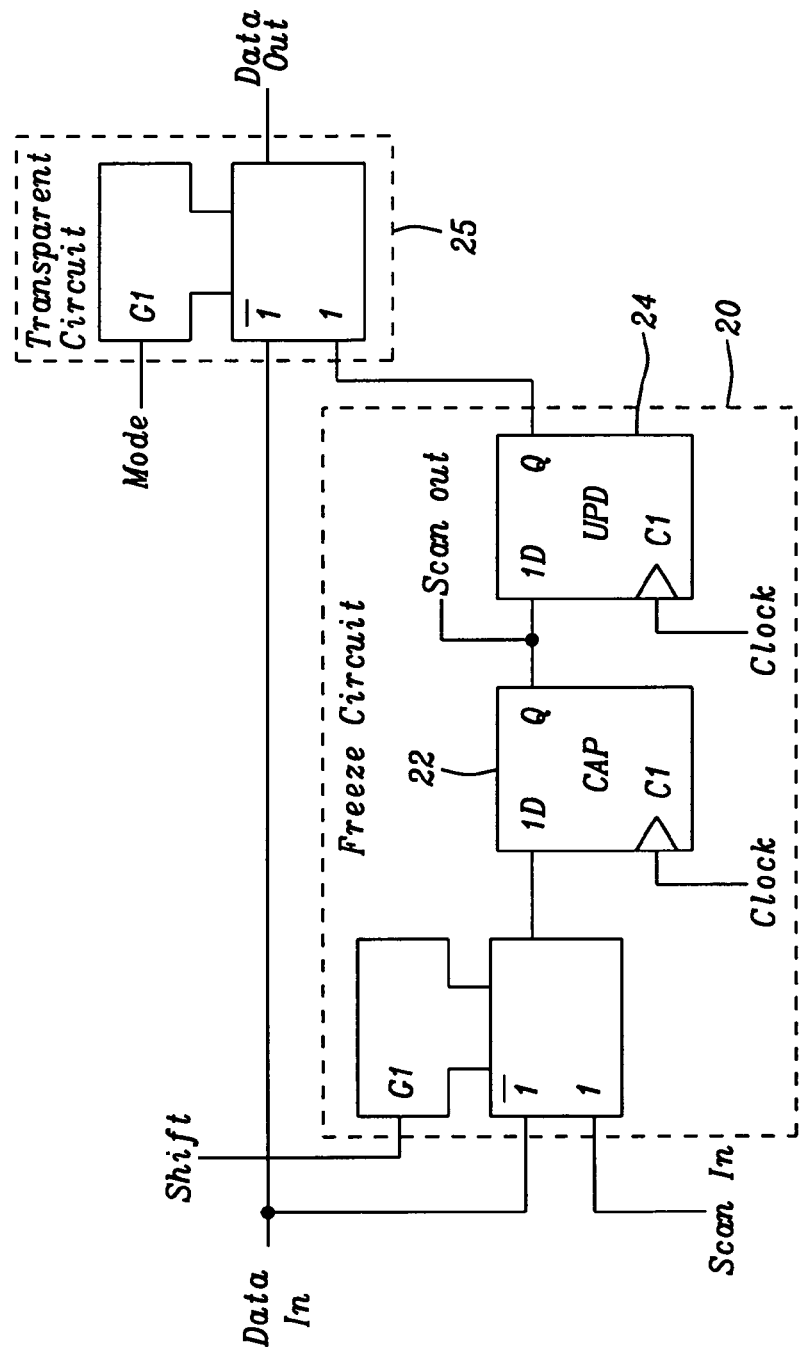
FIG. 2A – Prior Art

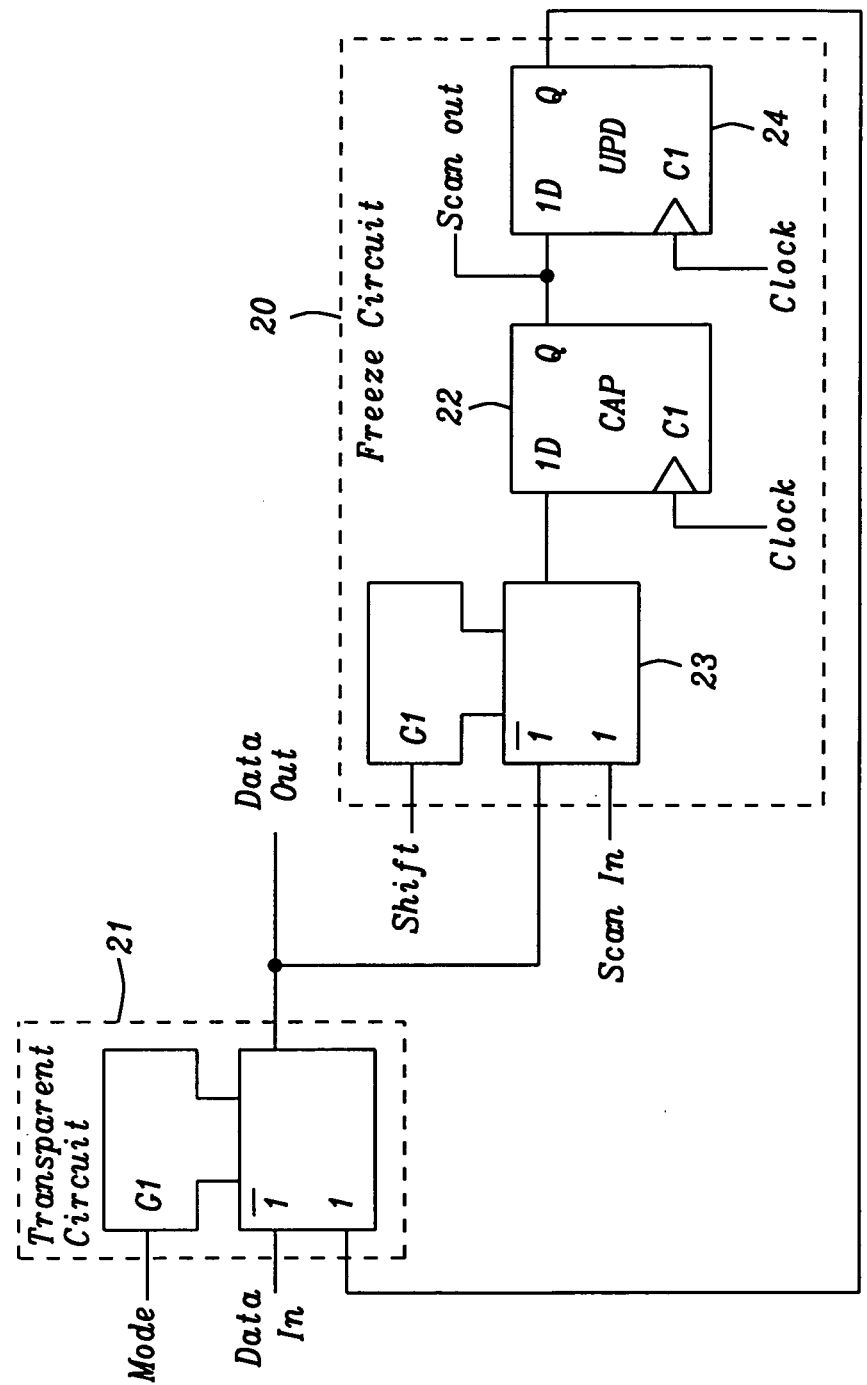
FIG. 2B – Prior Art

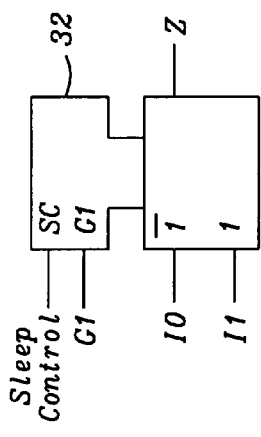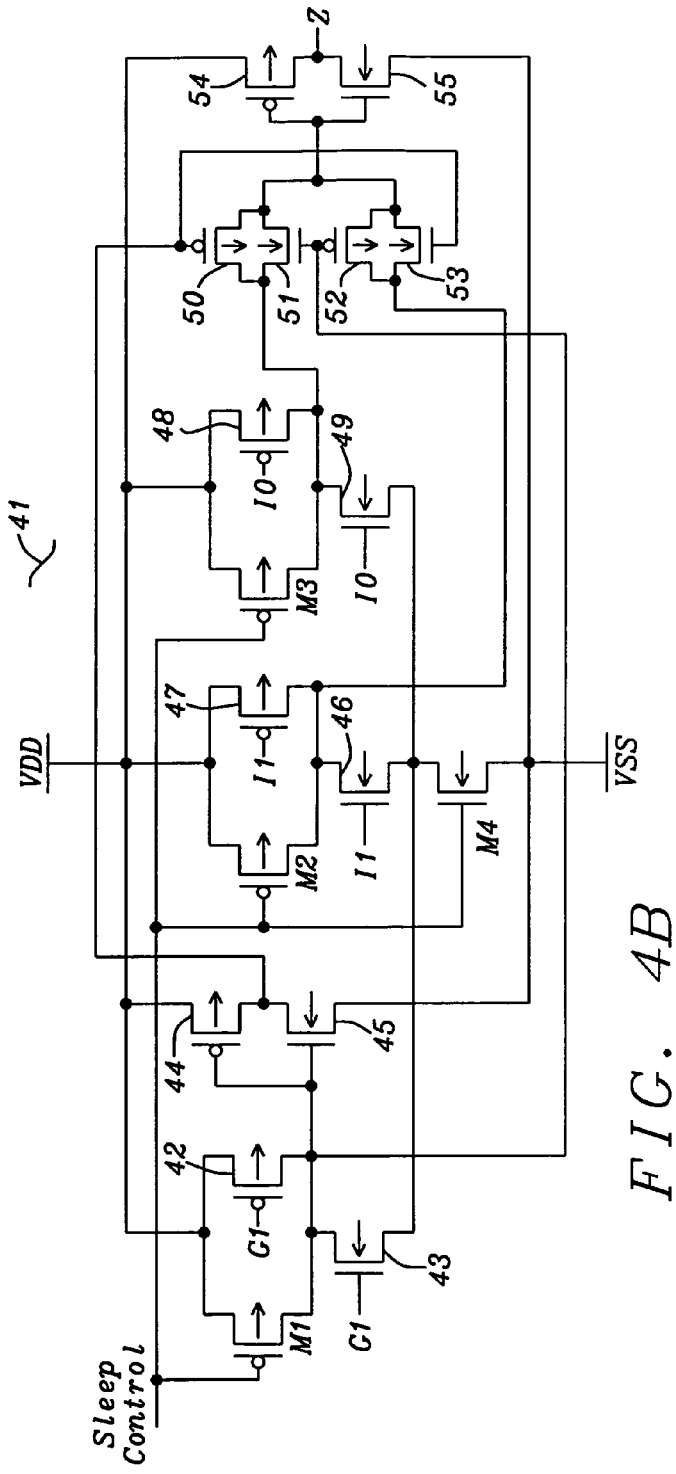
FIG. 4A
FIG. 4B

US 8,473,793 B2

LOW LEAKAGE BOUNDARY SCAN DEVICE DESIGN AND IMPLEMENTATION

BACKGROUND OF THE INVENTION

1. Field of Invention

The present invention relates to boundary scan circuitry and in particular the creation and use of the boundary scan circuitry to reduce power consumption and leakage problems during sleep mode.

2. Description of Related Art

Boundary scan is an architecture defined by IEEE Std. 1149.1 that is used for testing circuitry 1) between packaged integrated circuit chips and 2) to force test signals upon the core logic within an integrated circuit chip, both without the need to physically probe connections on a physical package, or printed circuit board. Boundary scan has proven very useful in determining shorts and opens that may exist in the wiring between semiconductor chips mounted on a board or similar package. Because the boundary scan circuitry is located at each I/O pin of an integrated circuit chip, boundary scan can also be useful in forcing logic signals on the internal core logic of the chip.

U.S. Pat. No. 7,167,991 B1 (Higashida) is directed to a method for reducing leakage current in an LSI chip using a scan path and a backup power region, where scan data from a main power region is saved into the backup power region. U.S. Pat. No. 6,671,860 B2 (Langford I I.) is directed to a structure and method for using an enhanced boundary scan register structure to permit flexible application of "stuck at fault" or normal operation at each I/O pad of an integrated circuit chip. In U.S. Pat. No. 6,658,632 B1 (Parulkar et al.) a design is directed to a high speed boundary scan cell for output pins, where location of conventional functional storage element and multiplex stages has been rearranged, which allows functional data to be latched into a storage element after multiplexing with boundary scan data. In U.S. Pat. No. 6,429,454 B2 (Hatada et al.) a method is directed to an implementation of a test using a boundary scan circuit synchronized with a cycle time defined by a normal operating clock signal.

U.S. Pat. No. 6,185,710 B1 (Barnhardt) is directed to circuitry containing a boundary scan cell that is connected to a second input and a control input to a slave latch of a master-slave combination so that the boundary scan cell can provide control signal and data to the slave latch. U.S. Pat. No. 6,108,807 (Ke) is directed to a method and apparatus to provide a hybrid pin control of output pins using a boundary scan architecture. U.S. Pat. No. 5,859,860 (Whetsel) is directed to a low overhead input and output boundary scan cells that include latchable input and output buffers from circuitry within which the boundary scan cells are provided. U.S. Pat. No. 5,491,666 (Sturges) is directed to a plurality of boundary scan cells, each associated with different portions of logic on an integrated circuit chip in which registers of the individual boundary scan circuits are chained together to create a series boundary scan chain to manipulate circuitry within the integrated circuit chip. U.S. Pat. No. 5,490,151 (Ferger et al.) is directed to a boundary scan cell to enable testing of an electronic circuit, wherein the boundary scan cell is connected in series with other boundary scan cells that are associated with other circuits.

In FIG. 1A of prior art is shown the basic configuration of the architecture for boundary scan used on semiconductor chips. A logic signal is received by an input pad circuit (IPC) 10. Connected between the IPC and core logic 13 of the semiconductor chip is a boundary scan circuit 12. The output of the core logic 13 is connected to a boundary scan circuit 12, which further connects the output signal to an output pad circuit (OPC) 14. The architecture of boundary scan was developed primarily to test interconnect between packaged devices and was expanded to allow testing of core logic 13. A test access port (TAP) controller 15 located on the semiconductor chip is used to control the boundary scan circuits and the shifting of data between the boundary scan circuits using a scan in 16 and scan out 17 method.

FIG. 1B demonstrates an architectural configuration where a boundary-scan cell (BC) 17 is interposed between logic blocs 18a and 18b and pad cells 16 on a chip or multiple chips as represented by logic block 1 (18a) and logic block 2 (18b). The tap controller 15 controls the operation of the boundary-scan circuits 17. The pad cells 16 are either receiving devices IPC or output devices OPC depending on the structure of the logic of the logic blocks 18a and 18b. Each pad cell 16 is connected to a BC Cell 17, which is further connected to the logic blocks 18a and 18b.

FIG. 2A shows a boundary scan circuit 12 of prior art in which "Data In" is connected to the boundary scan circuit from an input pad circuit 10. The boundary scan circuit has two portions, a freeze circuit 20 and a transparent circuit 25. The freeze circuit 20 is used to scan test data in and out in of a shift register formed by interconnected boundary circuits and to capture data present on the "Data In" from a pad cell. A capture register CAP 22 is clocked to capture "Data In" or "Scan In" from the input register 23. The data captured by the capture register 22 is scanned out to an adjacent boundary scan circuit (scan out) and can be used to update the data in the update register (UPD) 24 under the control of an update clock. The transparent circuit 25 receives data from the "Data In" emanating from the connected pad cell and from the update register 24. A mode signal connected to G1 of the transparent circuit 21 selects either "Data In" or the output of the update register 24 to be connected to "Data Out".

FIG. 2B shows a boundary scan circuit of prior art in which "Data Out" of the transparent circuit 21 serves as an data source for the freeze circuit 20. "Data In" connected to the Transparent circuit 21 provides a data signal from a semiconductor chip internal logic circuits and "Data Out" is connected to an output pad cell OPC (FIG. 1A). The operation of the freeze circuit 20 and the transparent circuit 21 in FIG. 2B is the same as described for FIG. 2A.

The pad cells IPC and OPC comprise input and output circuits, bidirectional circuits, and the pad cell can comprise a pull up or pull down function, latch-up protection and ESD (electrostatic discharge) circuit. During the application of a sleep mode to circuitry in a digital system, it is possible that a circuit providing "Data In" to the boundary scan device floats or is otherwise is in a voltage state that causes a leakage current to flow through the transparent circuit. The prevention of this leakage current is important to reducing power in sleep mode as well as providing stability to the computer system, thereby restricting the output signals of the boundary scan circuitry from affecting the core logic of the integrated circuit chips upon which the boundary scan circuitry is resident.

SUMMARY OF THE INVENTION

It is an objective of the present invention to provide circuitry and control to block signals including leakage current from flowing through a transparent circuit of a boundary scan circuitry and isolate internal core logic of an integrated circuit device from unwanted signals particularly during sleep mode.

It is also an objective of the present invention to use power-gating transistors to negate the mode control, and block data inputs to the transparent circuit during a sleep mode.

During sleep mode imposed on digital logic, all or a portion of connected logic can be placed into a sleep mode. The sleep mode can span several integrated circuit devices, each having pad cells and boundary scan circuitry. The pad cells are receivers and drivers of the integrated circuit devices and comprise input and output circuits including bidirectional circuits and further comprising pull up and pull down function, latch up prevention circuitry and ESD circuitry. During sleep mode it is possible for output circuitry to float or be in a voltage state that promotes a leakage current through a transparent circuit of boundary scan circuitry.

The boundary-scan circuitry of the present invention comprises a freeze circuit portion and a transparent circuit portion. The freeze circuit portion is used for scanning in and out test data primarily used to test connection between assembled parts/devices. The transparent circuit portion is used to connect a pad device to internal logic of a device and to impose a sleep mode to prevent leakage caused by various voltage states of pad circuit devices. This leakage current is a source of power drain during sleep mode.

In the transparent circuit portion power-gating transistors are connected in parallel with the mode control transistor and the input transistors to negate the effects of mode control transistor and the input transistors when a sleep mode is imposed. This is accomplished when the low source-drain voltage of the power-gating transistors bias the source of the mode and input transistors to an off condition. An additional power-gating transistor is placed in series with the Vss power supply lead of the transparent circuit to block Vss bias, where the power-gating transistor is used to reduce the source-drain voltage drop in the Vss connection to the transparent circuitry.

In a first embodiment of the present invention for the transparency circuit portion of a boundary-scan circuit, a sleep control signal biases off the mode control and data input transistors and blocks Vss voltage from the transparent circuit circuitry. The freeze circuit portion of the boundary-scan circuit, which provides one of the data inputs to the transparent circuit portion, is biased off during sleep mode. The sleep mode controls the transparent circuit portion to provide a zero voltage at the output of the transparent circuit portion, which is further connected to system logic and held at that zero voltage level during sleep mode.

In a second embodiment of the present invention data input from logic contained on the same device that contains the transparent circuit is allowed to pass to the output of the transparent circuit while signals from a freeze circuit portion of the boundary-scan circuit are blocked to prevent leakage currents during sleep mode, and the freeze circuit portion is further powered off during sleep mode. The mode control transistor and the data input transistor connected to the freeze circuit portion are biased off by power-gating transistors controlled by the sleep mode signal. The connection to the mode control transistor and the input transistor connected to the freeze circuit from Vss is also blocked by a power-gating transistor. The data input transistors that receives logic signals is left uncontrolled by the sleep mode, allowing logic signals to propagate to the output of the transparent circuit portion and on to subsequent system logic.

Looking back at FIG. 1B, the capability to put the transparent circuit portion of the boundary scan circuit (BC) 17 in sleep mode can isolate the portion of logic in the logic block 18a or 18b, which are connected to the transparent circuit portion of BC 17. Powering down the freeze circuit portion of BC 17 can further save power. If the transparent circuit portion of the BC has the capability to connect input system data to the logic block 18a or 18b while the transparent circuit portion of the freeze circuit is placed into sleep mode, then that portion of logic connected the output of the transparent circuit can continue to operate during sleep mode. Thus the sleep mode logic blocks shown in FIG. 1B, 18a and 18b, can be partially or totally placed into sleep mode as a result of the transparent circuit of the present invention.

BRIEF DESCRIPTION OF THE DRAWINGS

This invention will be described with reference to the accompanying drawings, wherein:

FIG. 1A is a block diagram of prior art for the use of boundary-scan circuitry on a semiconductor chip;

FIG. 1B is a block diagram of prior art demonstrating a system level arrangement of boundary-scan circuits amongst interconnected semiconductor chips;

FIG. 2A is a block diagram of prior art of a boundary-scan circuit used to receive signals from another semiconductor chip;

FIG. 2B is a block diagram or prior art of a boundary-scan circuit used to connect signals to another semiconductor chip.

FIG. 4A is a block diagram of the present invention or the transparent circuit portion of the boundary-scan circuitry;

FIG. 4B is a detail circuit diagram of the present invention of the transparent circuit used to receive logic signals from another semiconductor chip.

DETAILED DESCRIPTION OF THE PREFERRED EMBODIMENT

Figure 3A:
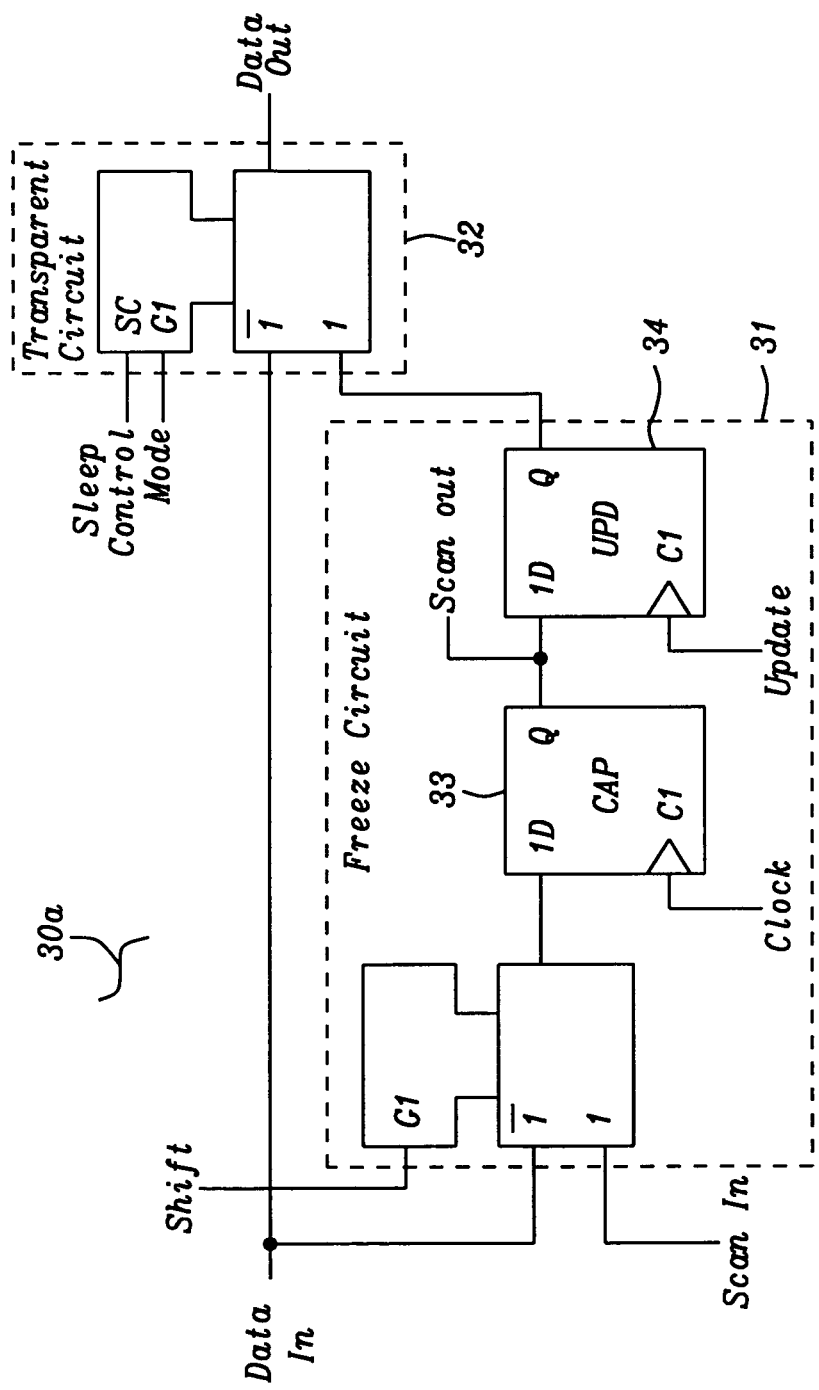
FIG. 3A is a boundary-scan circuit of the present invention for receiving logic signal from another semiconductor chip.

FIG. 3A shows a block diagram of the boundary scan circuit 30a of the present invention. "Data In" is connected to the boundary-scan circuit 30a from an input pad cell (IPC) not shown in FIG. 3A. The IPC can comprise a receiver circuit, a bidirectional circuit, a pull up and pull down function, latch up prevention circuitry and ESD circuitry. The boundary scan circuit comprises a freeze circuit portion 31 and a transparent circuit portion 32. The freeze circuit portion 31 is used to capture data from "Data In" or "Scan In" from which the freeze circuit 31 portion forms a part of a shift register chain. Data is shifted to a capture register (CAP) 33. Once data has been clocked into the capture register it can be scanned out to the next element in the shift register chain. Data can also used to update the update register (UPD) 34 using an update clock and further connected to a transparent circuit 32.

The transparent circuit forms a second portion of the boundary-scan circuit 30a. The mode control selects "Data In" or the output of the update register (UPD) 34 to be connected to "Data Out" by the transparent circuit 32. Besides the mode control the transparent circuit has a sleep control that prevents a leakage current resulting from the floating of driver circuits providing the "Data In" signal or other signal phenomenon that can disturb Data Out of the transparent circuit 32. Data Out is connected to internal chip logic and the "Data In" signal disturbance can cause an increase power drain on a system that has been placed partially of entirely into sleep mode to conserve power.

Figure 3B:
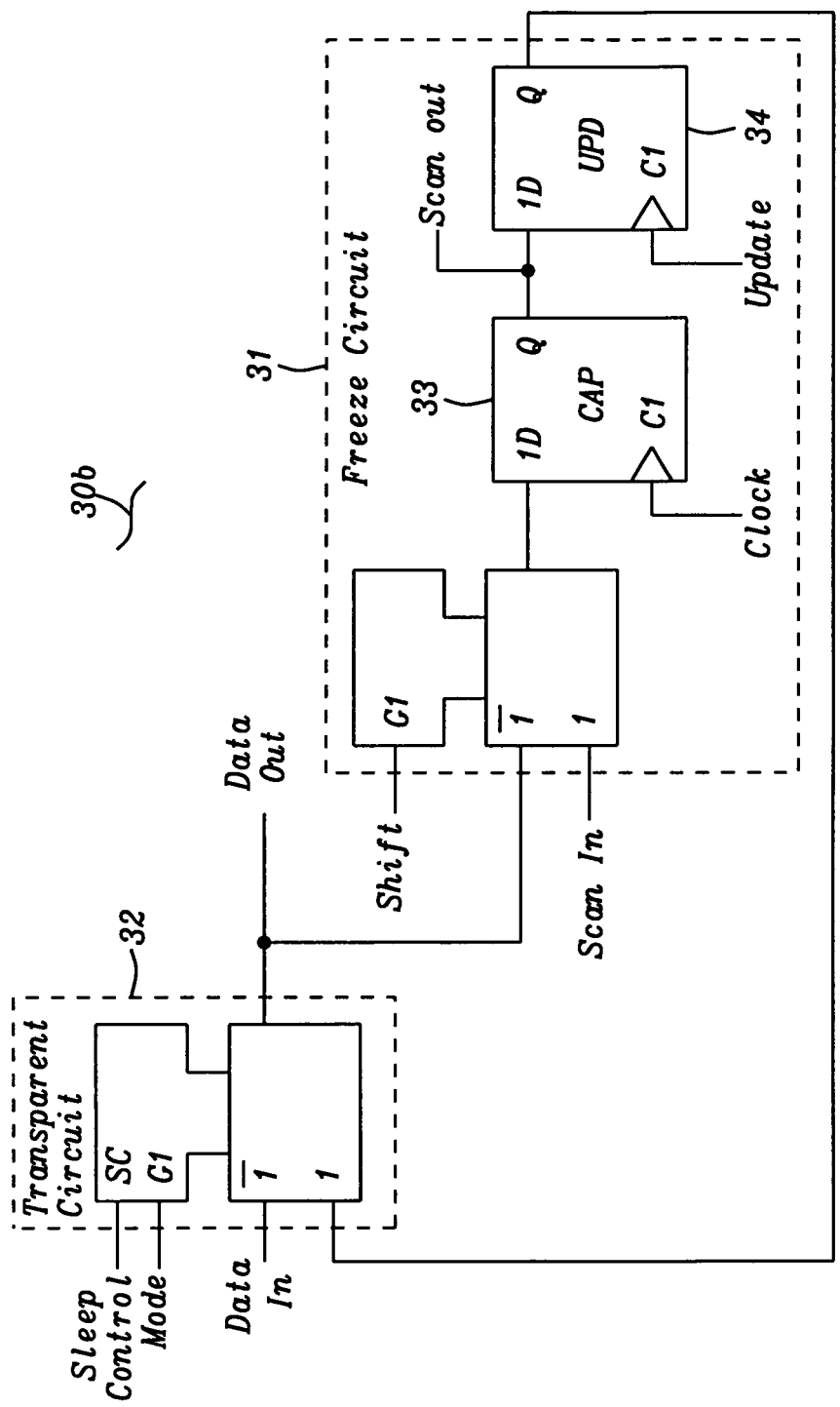
FIG. 3B is a boundary-scan circuit of the present invention for sending logic signals to another semiconductor chip.

In FIG. 3B is shown a configuration for a boundary scan circuit 30b, in which the freeze circuit 31 takes as an input the Data Out from the transparent circuit 32. A second input to the freeze circuit is "Scan In" data from the shift register chain in which the freeze circuit 31 is connected. Data is shifted to the capture register (CAP) 33 and clocked to Scan Out and the update register (UPD) 34. Data from the update register UPD 34 is connected to an input of the transparent circuit 32. A Mode Control of the transparent circuit 32 selects either the output of the update register (UPD) 34 or "Data In" from system logic. Data Out from the transparent circuit 32 is connected to a pad cell in which the pad cell can comprise a bidirectional circuit, a pull up or pull down circuit and an electrostatic discharge circuit. A "Sleep Control" connected to the transparent circuit 32 is used to block signal anomalies from propagating through the transparent circuit 32 from "Data In" to "Data Out" during sleep mode and causing a leakage current.

FIG. 4A is a symbolic diagram of the transparent circuit 32 of the present invention shown in FIGS. 3A and 3B. There are two data inputs In0 connected to the "not 1" input and In1 connected to the "1" input of the transparent unit. Mode control G1 selects which of the two data inputs, In0 or In1, is to be connected to the output Z. The Sleep Control SC places the transparent circuit 32 into sleep mode and prevents leakage currents from flowing to the output Z caused by signals on either input In0 and In1. The nomenclature used for the symbolic transparent circuit 32 will be used in the schematic diagrams of the transparent circuit.

FIG. 4B is a circuit diagram 41 of first embodiment of the transparent circuit 32. When the sleep control is off, +V, the mode select signal G1 connects to two transistors, a p-channel device 42 and an n-channel device 43, which selects either input In0 (Data In) or input In1 (Scan In), to connect to the select circuits formed by the p-channel transistor 50 and the n-channel transistor 51, and the select circuit formed by the p-channel transistor 52 and the n-channel transistor 53. The output of the select circuits connect to the input of the output circuit formed by the p-channel transistor 54 and the n-channel transistor 55, where the output circuit provides an output signal "Z". Input I0 or I1 is selected by the application of the G1 signal from the p-channel transistor 42 to the gates of the selector circuit gates of the n-channel transistor 51 and the p-channel transistor 52 while the inverted G1 signal is applied to the selector circuit gates of the p-channel transistor 50 and the n-channel transistor 53 through the inverter circuit formed by the p-channel transistor 44 and the n-channel transistor 45.

When the sleep control is on, 0V, p-channel transistors M1, M2, and M3 are turned on, and n-channel transistor M4 is turned off. Transistors M1, M2 and M3 are p-channel power-gating transistor and M4 is an n-channel power-gating transistor. The power-gating transistors M1, M2 and M3 have a lower source to drain voltage drop than the G1 input transistor 42, the In1 input transistor 47 and the In0 input transistor 48, respectively, thereby producing a higher source voltage on transistors 42, 47 and 48 and biasing transistors 42, 47 and 48 off. The n-channel power gating transistor M4 is used to block Vss from the G1, In1 and In0 input transistors. The high source voltage of M1 gates transistor 44 off and transistor 45 on, connecting 0V to the gates of the selector circuit transistors 50 and 53 while the gates of transistors 51 and 52 are biased to a high voltage from transistor M1. A high voltage from transistor M2 applied to the source of transistors 52 and 53 coupled with the aforementioned gate voltages biases transistors 52 and 53 off while a high voltage from M3 applied to the sources of transistors 50 and 51 biases both transistor on and connects a high voltage to the gates of the output transistors 54 and 55. The p-channel output transistor 54 is biased off and the output n-channel transistor 55 is biased on setting the output Z to 0V, thereby minimizing leakage current during sleep mode.

TABLE 1 summarizes the effect of sleep control on the transparent circuit of the first embodiment of the present invention where data in "I0" is connected to the transparent circuit from an input pad device and transferred to internal logic circuitry through the output "Z". Sleep control places the transparent into sleep mode when activated and connects 0V to the internal circuitry connected to the output "Z".

TABLE 1

| Sleep Control | M1  | M2  | M3  | M4  | Output Z        |
| ------------- | --- | --- | --- | --- | --------------- |
| +V (Off)      | Off | Off | Off | On  | I0 * G1 + I1 * G1 |
| 0 V (On)      | On  | On  | On  | Off | 0 V             |

Figure 4C:
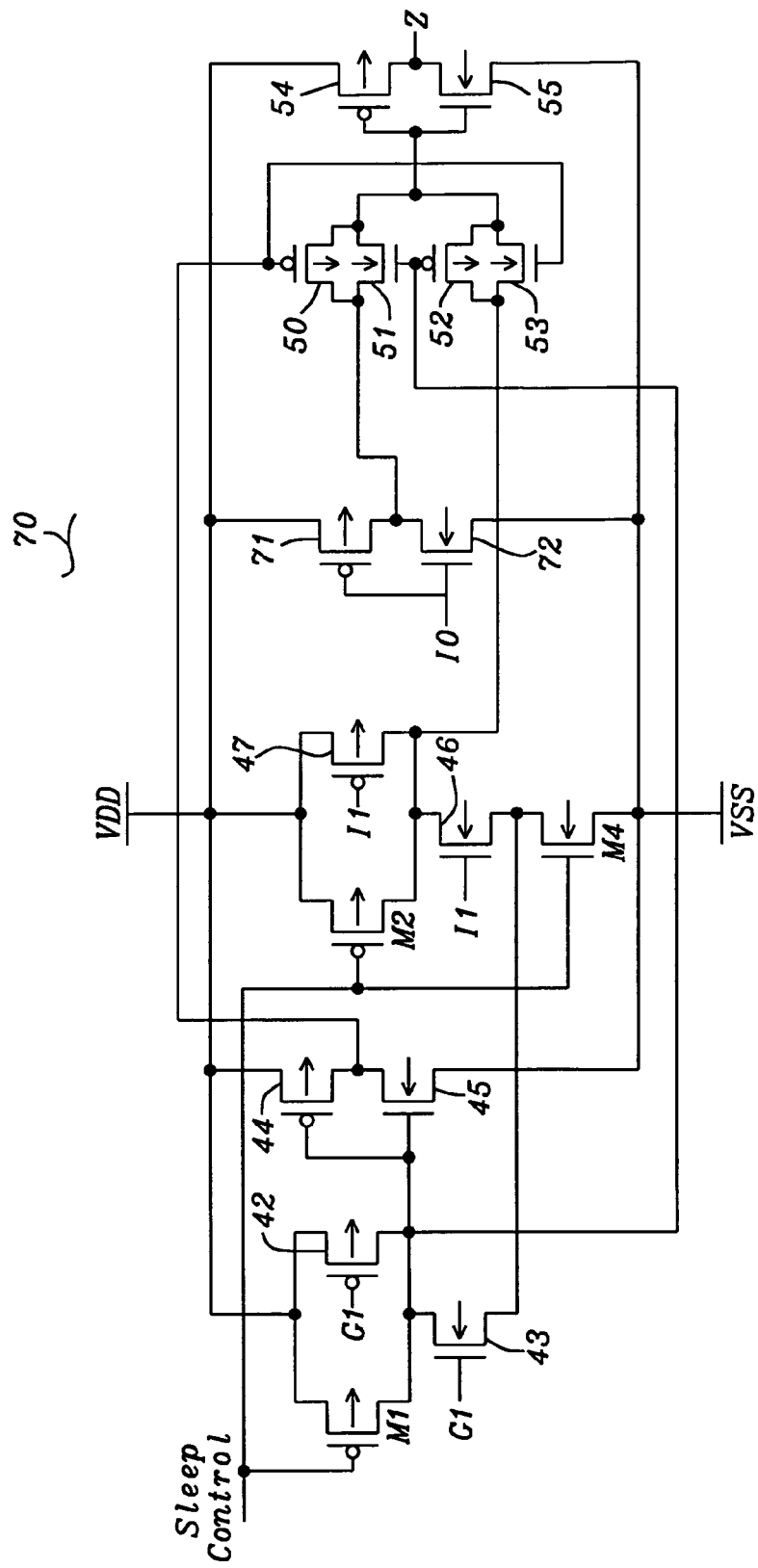
FIG. 4C is a detail circuit diagram of the present invention of the transparent circuit used to send logic signals to another semiconductor chip.

In the second embodiment of the present invention the transparent circuit 70 shown in FIG. 4C receives Data In (In0) from internal chip circuitry and delivers a Data Out signal Z to an output pad cell. The operation and control of the transparent circuit 70 is similar to that of the transparent circuit 40 of the first embodiment with the exception that in sleep mode the output Z represents the Data In (In0) signal. TABLE 2 summarizes the effect of sleep control on the second embodiment.

TABLE 2

| Sleep Control | M1  | M2  | M3  | M4  | Output Z        |
| ------------- | --- | --- | --- | --- | --------------- |
| +V (Off)      | Off | Off | N/A | On  | I0 * G1 + I1 * G1 |
| 0 V (On)      | On  | On  | N/A | Off | I0              |

When the sleep control is off, +V, in the circuit of the second embodiment, the mode select signal G1 connects to two transistors, a p-channel device 42 and an n-channel device 43, which selects either input In0 (Data In) or input In1 (Scan In). The mode select signal G1 controls the selection of the appropriate input to the select circuits formed by the p-channel transistor 50 and the n-channel transistor 51, and the select circuit formed by the p-channel transistor 52 and the n-channel transistor 53. The select circuits connect to the input of the output circuit formed by the p-channel transistor 54 and the n-channel transistor 55, where the output circuit provides an output signal "Z". Input I0 or I1 is selected by the application of the G1 signal from the p-channel transistor 42 to the gates of the n-channel transistor 51 and the p-channel transistor 52. At the same time an inverted G1 signal is applied to the selector circuit gates of the p-channel transistor 50 and the n-channel transistor 53 through the inverter circuit formed by the p-channel transistor 44 and the n-channel transistor 45.

When the sleep control is on, 0V, p-channel transistors M1 and M2 are turned on, and n-channel transistor M4 is turned off. Transistors M1 and M2 are p-channel power-gating transistor and M4 is an n-channel power-gating transistor. The power-gating transistors M1 and M2 have a lower source to drain voltage drop than the G1 input transistor 42 and the In1 input transistor 47, thereby producing a higher source voltage on transistors 42 and 47, which biases transistors 42 and 47 to the off state. The n-channel power-gating transistor M4 is used to block Vss from the G1 and In1 input transistors. The high source voltage of M1 gates inverter circuit transistor 44 off and transistor 45 on, thus connecting 0V to the gates of select circuit transistors 50 and 53 while the gates of transistors 51 and 52 are biased to a high voltage from transistor M1. A high voltage from transistor M2 applied to the source of transistors 52 and 53 coupled with the aforementioned gate voltages biases transistors 52 and 53 off while a voltage from M3 applied to the sources of transistors 50 and 51 biases both transistor on and connects the I0 voltage to the gates of the output transistors 54 and 55. The p-channel output transistor 54 is biased off and the output n-channel transistor 55 is biased on setting the output Z to I0 voltage, thereby allowing I0 to be connected to the output Z during sleep mode.

While the invention has been particularly shown and described with reference to preferred embodiments thereof, it will be understood by those skilled in the art that various changes in form and details may be made without departing from the spirit and scope of the invention.

What is claimed is:

1. A boundary scan cell, comprising;
    a) a transparent circuit coupled to a freeze circuit, wherein said freeze circuit forms a portion of a scan network, and wherein said transparency circuit further comprises:
        i) a plurality of data input ports;
        ii) a data output;
        iii) a mode select; and
        iv) a sleep control;
    b) said mode select chooses which data input port of said plurality of data input ports to connect to said data output when said sleep control is in an off state; and
    f) said sleep control, when activated, controls a data input circuitry and a mode select circuitry to an off state and forces the data output to a controlled state during a sleep mode thereby minimizing leakage current.

2. The boundary scan cell of claim 1, wherein said plurality of data input ports further comprises a first data input from a logic circuitry and a second data input from said freeze circuit.

3. The boundary scan cell of claim 2, wherein said first data input from the logic circuitry external to a device containing said transparent circuit, said data output connects to the logic circuitry contained on said device, and said controlled state of the data output is zero volts.

4. The boundary scan cell of claim 2, wherein said first data input from the logic circuitry internal to a device containing said transparent circuit, said data output couples to the logic circuitry contained on an external device and said controlled state of the data output is said first data input from the logic circuitry internal to the device containing the transparent circuit.

5. The boundary scan cell of claim 1, wherein said sleep control is implemented to selectively control portions of the logic circuitry to which data output is connected during the sleep mode.

6. The boundary scan cell of claim 1, wherein said minimizing leakage current allows a reduction of power drain during the sleep mode.

7. A method for minimizing leakage current during sleep mode in a transparent circuit connected to a boundary scan circuit, comprising:
    a) connecting a first power-gating transistor in parallel with a mode select input transistor of a transparent circuit of a boundary scan circuit;
    b) connecting a second power-gating transistor in parallel with a first data input transistor of said transparent circuit;
    c) connecting a third power-gating transistor in parallel with a second data input transistor of said transparent circuit;
    d) connecting a fourth power gating transistor in series with transistors connecting Vss bias to the mode select, first data input and second input transistors; and
    e) initiating sleep mode by applying a sleep signal to gates of the first, second, third and fourth power-gating transistors and controlling the output of the transparent circuit to a known logic state to prevent leakage current from flowing between I/O pads and internal logic of a semiconductor device.

8. The method of claim 7, wherein the first, second and third power transistors are p-channel transistors and when gated on, bias the mode select input transistor, the first data input transistor and the second data input transistor to an off state.

9. The method of claim 7, wherein said fourth power-gating transistor is an n-channel transistor, which disconnects Vss from transistors comprising the mode select input, first data input and second data input.

10. The method of claim 7, wherein said first data input connects system logic signals from external to a device containing the transparent circuit to circuitry contained on said device through the output of said transparency circuit.

11. The method of claim 7, wherein said second power-gating transistor is not connected in parallel with a first data input transistor and said first data input connects logic signals from internal to a device containing the transparent circuit to circuitry contained external to said device during sleep mode.

12. The method of claim 7, wherein said second data input connects scan data from said boundary scan circuit to subsequent system logic under control of a signal connected to said select transistor.

13. The method of claim 7, wherein said boundary scan circuit further comprises a freeze circuit to implement test scan capability in which the freeze circuit is powered off during sleep mode.

* * * * *